(12) United States Patent
Bissey et al.

(10) Patent No.: US 6,235,622 B1
(45) Date of Patent: May 22, 2001

(54) METHOD AND APPARATUS FOR ISOLATING A CONDUCTIVE REGION FROM A SUBSTRATE DURING MANUFACTURE OF AN INTEGRATED CIRCUIT AND CONNECTED TO THE SUBSTRATE AFTER MANUFACTURE

(75) Inventors: Lucien J. Bissey, Boise; Bryan C. Carson; Gordon D. Roberts, both of Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/382,219

(22) Filed: Aug. 24, 1999

Related U.S. Application Data

(62) Division of application No. 09/032,181, filed on Feb. 27, 1998, now Pat. No. 6,137,119.

(51) Int. Cl.[7] .................................................. H01L 21/44
(52) U.S. Cl. ......................... 438/598; 438/353; 438/618
(58) Field of Search ..................................... 438/598, 618, 438/620, 218, 353; 257/48, 500, 506

(56) References Cited

U.S. PATENT DOCUMENTS

| | | | |
|---|---|---|---|
| 4,888,631 | * 12/1989 | Azuma et al. | 257/48 |
| 5,768,195 | * 6/1998 | Nakamura et al. | 365/189.09 |
| 5,848,017 | * 12/1998 | Bissey | 365/201 |
| 5,869,877 | * 2/1999 | Patrick et al. | 257/48 |
| 5,936,898 | * 8/1999 | Chi | 365/190 |

* cited by examiner

Primary Examiner—T. N. Quach
(74) Attorney, Agent, or Firm—Dorsey & Whitney LLP

(57) ABSTRACT

Methods of processing semiconductor circuits are disclosed. In one embodiment, a method of processing a semiconductor circuit includes isolating a conductive region of the semiconductor circuit from a substrate region of the semiconductor circuit while forming the semiconductor circuit, and connecting the conductive region to the substrate region after the forming of the semiconductor circuit is completed. In alternate embodiments, the isolating and connecting of the conductive and substrate regions may include de-activating and activating a transistor, respectively.

16 Claims, 4 Drawing Sheets

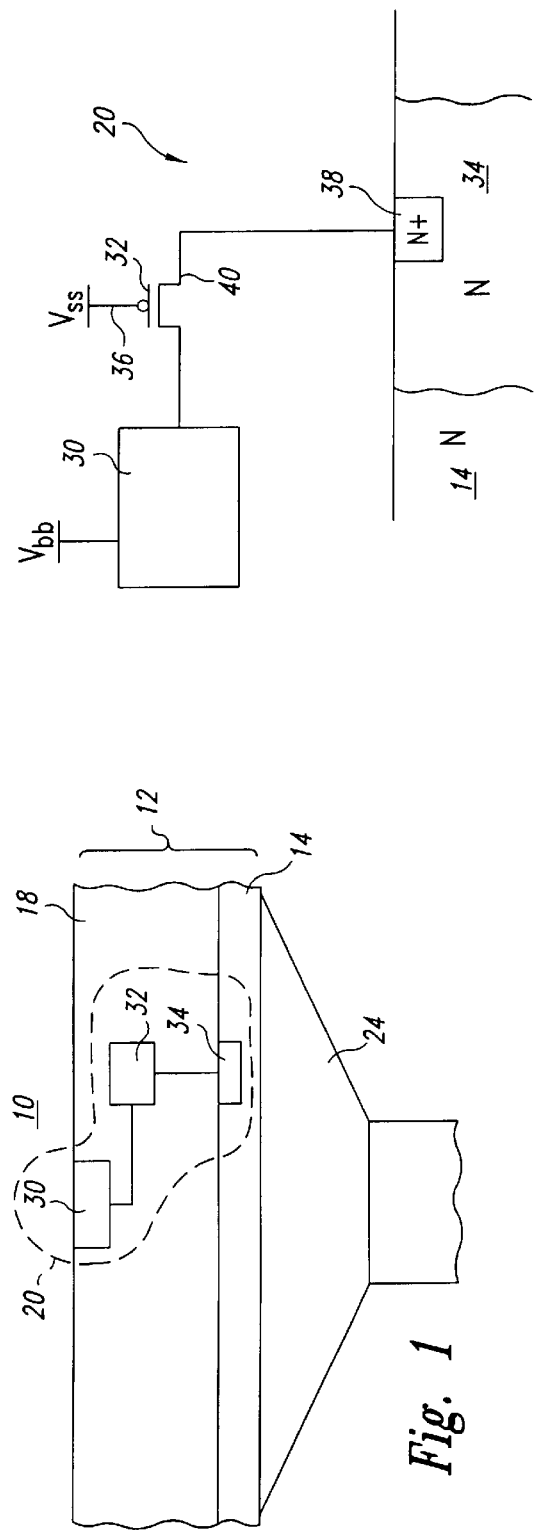
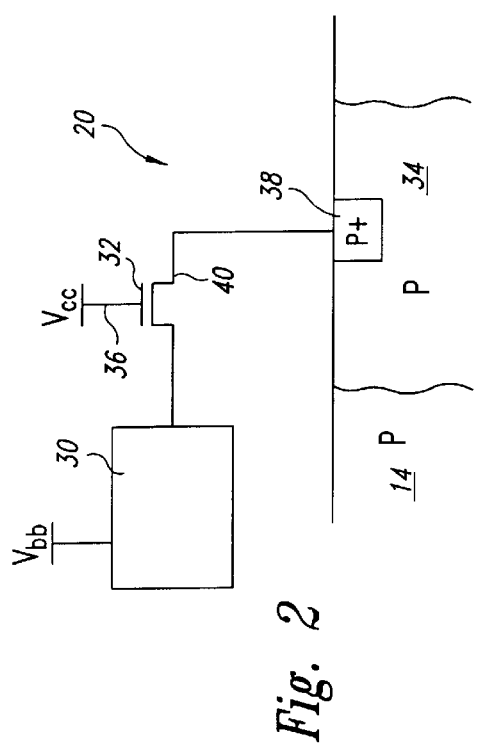
Fig. 1
Fig. 2
Fig. 3

METHOD AND APPARATUS FOR ISOLATING A CONDUCTIVE REGION FROM A SUBSTRATE DURING MANUFACTURE OF AN INTEGRATED CIRCUIT AND CONNECTED TO THE SUBSTRATE AFTER MANUFACTURE

CROSS-REFERENCE TO RELATED APPLICATION

This application is a divisional of U.S. patent application Ser. No. 09/032,181, filed Feb. 27, 1998, U.S. Pat. No. 6,137,119.

TECHNICAL FIELD

The invention relates generally to integrated circuits and more specifically to an integrated circuit that provides isolation between a conductive region and a substrate during wafer processing and that allows coupling of the conductive region to the substrate after wafer processing.

BACKGROUND OF THE INVENTION

To facilitate the testing of an integrated circuit at different back-bias voltages, a popular technique is to form a conductive back-bias pad that is coupled to a substrate region, such as a well or a portion of the substrate itself. Today, many manufacturers set the thresholds of the transistors that compose their integrated circuits by biasing the bulk regions of the transistors with a substrate- or well-bias voltage. (The bulk regions are the substrate or well regions in which the transistor channels are formed.) For clarity, such a bias voltage is hereinafter referred to as a substrate-bias voltage, it being understood that this term also encompasses bias voltages applied to wells or other regions of an integrated circuit. When a substrate-bias voltage other than a supply voltage is to be used, it is often desirable to test a circuit with different values of the substrate-bias voltage to determine an optimum value. To allow such testing, the conductive substrate-bias pad is formed in an upper layer of the circuit and is coupled to a substrate region as described above. During testing, a test probe contacts the pad and supplies the different values of the substrate-bias voltage. But during normal operation of the circuit, the substrate-bias voltage is typically generated by an onboard charge pump. Therefore, because it is needed only during the testing of the circuit, the bias pad is typically not bonded out to a pin of the circuit package, and is thus typically inaccessible to the customer.

Because the bias pad is connected to the substrate region during processing of the integrated circuit, the pad and any conductive regions that are in electrical contact with the pad may deposit or etch at significantly different rates than conductive regions that are in the same layers, respectively, as the other conductive regions but that are insulated from the pad. During processing, the substrate, i.e., the "back" of the wafer, is typically biased at a first voltage potential, and the layers formed on the substrate, ie., the "front" of the wafer, are either biased or allowed to float to a different voltage potential to allow the processing of these layers. Furthermore, the etch and deposition rates of the materials that compose the layers often depend on the voltage potential of the wafer front. Because the bias pad is coupled to the substrate, it is at a different potential than the rest of the wafer front. Therefore, the bias pad and the conductive regions in contact with the pad may etch and deposit at rates that are different than expected.

Unfortunately, the different etch and deposition rates may cause defects in the integrated circuit. For example, a passivation layer is often formed over the bias pad and other portions of the wafer, and then is etched to expose the bias pad and other pads. The amount of etching is based on the anticipated thicknesses of the passivation layer and the respective pads. But if the bias pad is thinner than the other pads because its different potential caused it to be under-deposited, then the etch may not go all the way through the passivation layer to the bias pad, which thus remains unexposed. Or, if the bias pad is thicker than the other pads because its different potential caused it to be over-deposited, then the etch may damage the bias pad. Unfortunately, an unexposed or damaged bias pad often cannot be probed.

SUMMARY OF THE INVENTION

In one embodiment of the invention, an integrated circuit includes an enable terminal, a semiconductor substrate, a conductive region, and a transistor. A substrate region is disposed within the substrate, and the conductive region is disposed out of contact with both the substrate and the substrate region. The transistor includes a first terminal that is coupled to the substrate region, a second terminal that is coupled to the conductive region, and a control terminal that is coupled to the enable terminal.

During the processing of the integrated circuit, the transistor can electrically isolate the conductive region from the substrate region. Therefore, because it is at the potential of the wafer front, the conductive region and any conductive regions in contact therewith will etch and deposit at substantially the same rate as the noncontacting regions of the respective layers. Furthermore, during testing of the circuit, the transistor can couple a signal, such as a back-bias voltage, from the conductive region to the substrate region.

BRIEF DESCRIPTION OF THE DRAWINGS

FIG. 1 is a cross-sectional side view of a semiconductor processing chamber and a circuit according to an embodiment of the invention.

FIG. 2 is a circuit diagram of the circuit of FIG. 1 according to another embodiment of the invention.

FIG. 3 is a circuit diagram of the circuit of FIG. 1 according to yet another embodiment of the invention.

DETAILED DESCRIPTION OF THE INVENTION

Figure 4:
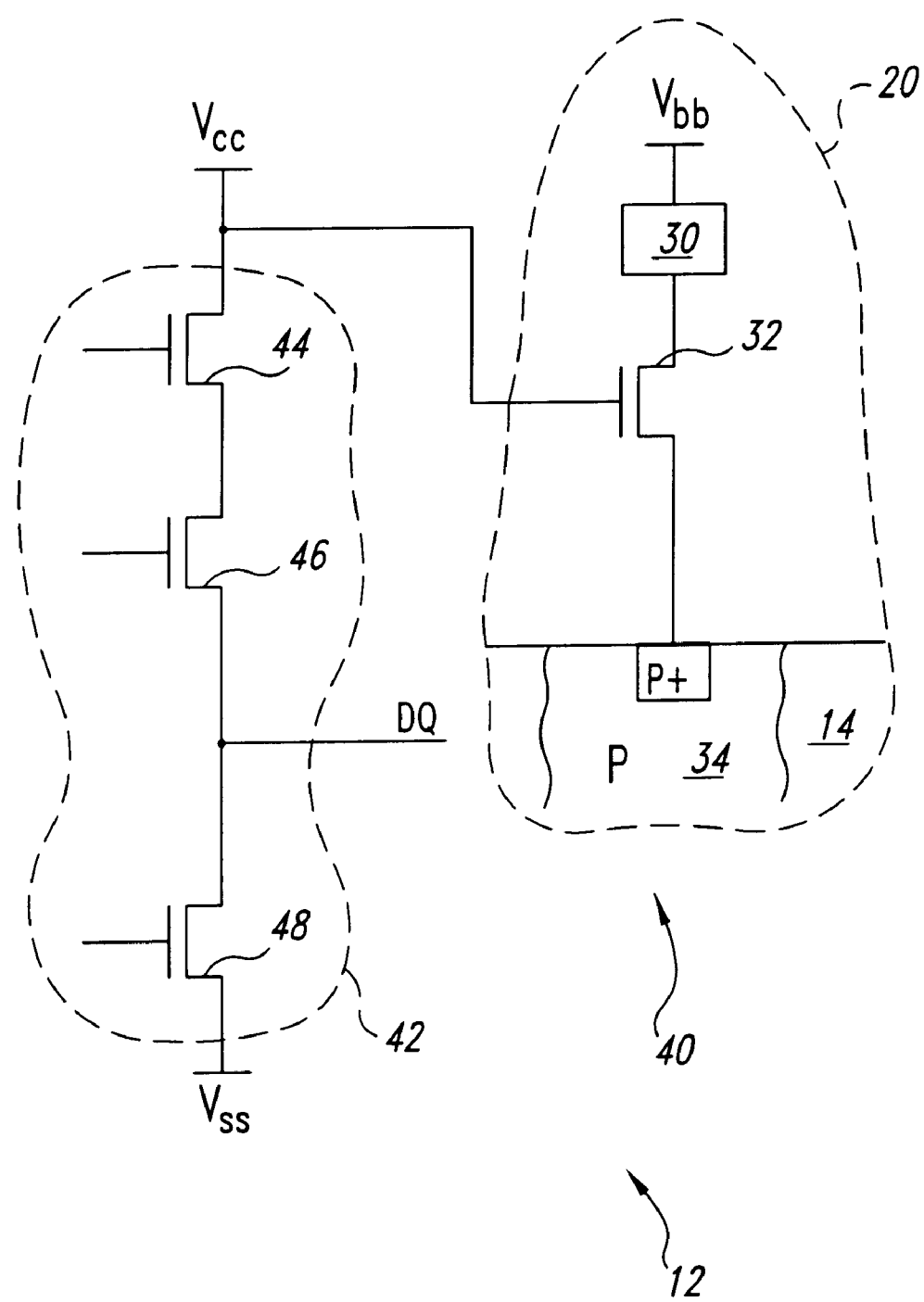
FIG. 4 is a circuit diagram of the circuit of FIG. 2 according to still another embodiment of the invention.

FIG. 1 is a cross-sectional side view of a semiconductor processing chamber 10 in which an integrated circuit (IC) 12 is being processed according to one embodiment of the invention. The IC 12 includes a substrate 14 and one or more layers 18 in which a circuit 20 is fabricated. A conductive chuck 24 supports the IC 12. Typically, a vacuum is drawn to firmly hold the IC 12 to the chuck 24. The circuit 20 includes a conductive pad 30, a transistor 32, and a region 34 of the substrate 14. In one embodiment, the pad 30 and the transistor 32 are disposed in one or more of the layers 18. Alternatively, the transistor 32 may be disposed in the substrate 14, or may have respective portions disposed both in the substrate 14 and in one or more of the layers 18. As discussed below in conjunction with FIGS. 2 and 3, the region 34 may be a continuous portion of the substrate 14, i.e., a portion having the same doping concentration as the other portions of the substrate 14, or may be a well having a different doping than the substrate 14.

Still referring to FIG. 1, during processing of the IC 12, the chuck 24 biases the substrate 14 to a first potential, and the layers 18 are biased or are allowed to float to a second potential. The transistor 32 is disabled so that it electrically isolates the pad 30 from the region 34. Therefore, because it is at the same potential as the other portions of the layers 18, the pad 30 and any conductive regions coupled thereto will etch and deposit at the same rates as the other portions of the respective layers 18. After the IC 12 is completed, the transistor 32 can be enabled so that it couples a signal, such as a substrate-bias voltage, from the pad 30 to the region 34. So that it introduces little or no loss to the signal, the transistor 32 can be constructed to have a low on resistance, for example, a few ohms.

FIG. 2 is a diagram of the circuit 20 of FIG. 1 according to one embodiment of the invention. In this embodiment, the region 34 is a continuation of the substrate 14, which is doped p-type, and the transistor 32 is an NMOS transistor that has a gate terminal 36 coupled to a positive supply voltage Vcc. An optional p+ contact region 38 may be disposed in the region 34 to provide a low-resistance path between the region 34 and a drain/source terminal 40 of the transistor 32.

Still referring to FIG. 2, during processing of the IC 12 of FIG. 1, Vcc is not supplied to the pad 30. Therefore, because it is off, the transistor 32 electrically isolates the region 34 from the pad 30. After completion of the IC 12, for example during testing of the IC 12, Vcc is supplied. Therefore, because the transistor 32 is on, it can couple a substrate-bias voltage Vbb from the pad 30 to the region 34. Because the region 34 is p-type, Vbb is typically a negative voltage, for example between −1V and −3V. Therefore, because the gate 36 of the transistor 32 is coupled to Vcc, the NMOS transistor 32 fully couples Vbb from the pad 30 to the region 34. That is, the transistor 32 does not introduce a threshold-voltage drop between the pad 30 and the region 34. But where a threshold drop is acceptable, the transistor 32 may be a PMOS transistor having its gate coupled to a negative voltage such as Vbb itself. For example, if Vbb=−3V, and the threshold of the PMOS transistor is −1V, then the PMOS transistor would couple only −2V to the region 34.

Although FIG. 2 shows the region 34 as a mere continuation of the substrate 14, the region 34 may instead be a p+ well (not shown) that is disposed in the substrate 14. In such an embodiment, even though they have different doping concentrations, because both the region 34 and the substrate 14 are p-type, the region 34 will couple the substrate-bias voltage to the substrate 14. Furthermore, because the region 34 is p+, the contact region 38 is unnecessary.

The substrate 14 is shown in FIG. 2 as being doped p-type. Therefore, the region 34 is typically not doped n-type because a pn junction would be formed, and thus a pn-junction threshold voltage would exist between the region 34 and the substrate 14 when the transistor 32 is on. However, if such a pn junction and diode threshold are acceptable, then the region 34 (and, if present, the contact region 38) may be doped n-type. For example, if Vbb=−3V, then only approximately −2.3V would be coupled to the p-type substrate 14.

Otherwise, the operation of the circuit 20 is the same as described for a p-type region 34. Alternatively, where the substrate 14 is doped p-type and the region 34 is an n-type well region, a first circuit 20, such as the FIG. 2 embodiment thereof, can be used to bias the substrate 14, and a second circuit 20, such as an embodiment thereof shown in FIG. 3 and described below, can be used to bias the region 34. The only limitation is that the substrate 14 should not be biased more than 0.7 V higher than the region 34, or else a conducting forward-biased diode may result.

Additionally, it may be desired that the transistor 32 be off during normal operation of the IC 12. Thus, the gate 36 of the transistor 32 may be coupled to a control signal such that, during testing, the control signal activates the transistor 32 to couple the pad 30 to the region 34, and during normal operation, the control signal deactivates the transistor 32 to electrically isolate the pad 30 from the region 34.

FIG. 3 is a diagram of the circuit 20 of FIG. 1 according to another embodiment of the invention. In this embodiment, the transistor 32 is a PMOS transistor having its gate 36 coupled to Vss, the region 34 is n-type, and the contact region 38 is n+. Because the region 34 is n-type, Vbb is typically positive, for example between 1V and 3V. Thus, because it is a PMOS transistor, the transistor 32 can typically fully couple Vbb to the region 34. Otherwise, this embodiment of the circuit 20 functions in a manner similar to that of the embodiment of FIG. 2.

Still referring to FIG. 3, as with the NMOS transistor 32 of FIG. 2, the PMOS transistor 32 of FIG. 3 can be coupled to a control signal instead of Vss. Also, although the region 34 is shown in FIG. 3 as a mere continuation of the n-type substrate 14, the region 34 may be an n+ well region. Additionally, if a pn junction and a diode threshold drop between the substrate 14 and the region 34 are acceptable, then the region 34 may be a p-type well region (not shown) having an optional p+ contact region 38. Alternatively, where the substrate 14 is doped n-type and the region 34 is a p-type well region, then a first circuit 20, such as the FIG. 3 embodiment thereof, can be used to back-bias the substrate 14, and a second circuit 20, such as the FIG. 2 embodiment thereof can be used to bias the region 34. The only limitation is that the region 34 should not be biased more than 0.7 V higher than the substrate 14, or else a conducting forward-biased diode may result.

Referring to FIGS. 2 and 3, although the region 34 is shown disposed directly in the substrate 14, in other embodiments the region 34 may be disposed in a well region (not shown) of the substrate 14. For example, the region 34 may be a first n- or p-type well region that is disposed in a second n- or p-type well region (not shown). Likewise, the second well region may be disposed directly in the substrate 14 (which also may be either n- or p-type), or may be disposed in a third n- or p-type well region (not shown). Thus, there may be one or more well regions that separate the region 34 from the substrate 14.

FIG. 4 is a diagram of the circuit 20 of FIG. 2 according to another embodiment of the invention. In this embodiment, the transistor 32 is disposed on the IC 12 in or near a data output region 40, which includes one or more data-output drivers 42. The driver 42 includes NMOS transistors 44, 46, and 48, which are controlled by an intermediate circuit stage (not shown in FIG. 4) and which drive a data terminal DQ. The transistors 44, 46, and 48 typically have large width-to-length ratios such that they have low on resistances, typically on the order of a few ohms. As discussed above in conjunction with FIG. 1, some embodiments of the transistor 32 also have low on resistances. Therefore, in such an embodiment, the transistor 32 may be made virtually identical to the transistors 44, 46, and 48. Because it is virtually identical to the transistors 44, 46, and 48, the addition of the transistor 32 adds little or no complexity to the processing of the IC 12. Additionally, because the data output region 40 typically has sufficient room for one or more additional transistors, locating the transistor 32 or the entire circuit 20 near or in the region 40 adds little or no layout area to the IC 12. Although locating only the transistor 32 near or in the region 40 may give rise to relatively large distances between the pad 30, transistor 32, and region 34, such distances will cause little or no degradation in the performance of the circuit 20 because the transistor 32 operates mainly under DC conditions. Moreover, a PMOS transistor 32 can also be located in the data output region 40. Additionally, if the transistors 44 and 46 are PMOS transistors, then such a PMOS transistor 32 can be made virtually identical to these transistors.

Figure 5:
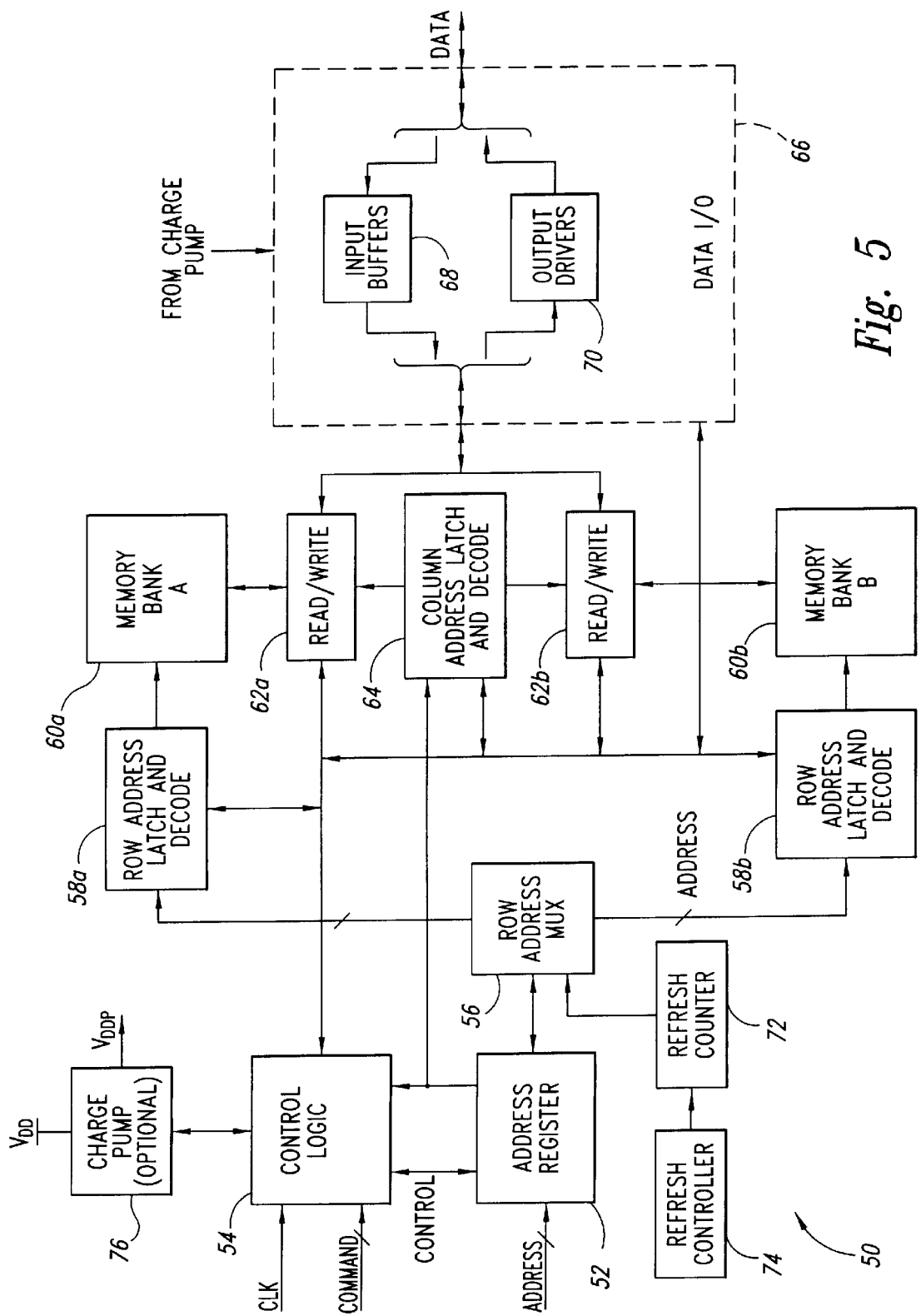
FIG. 5 is a block diagram of a memory circuit that includes the circuit of FIG. 1.

FIG. 5 is a block diagram of a memory circuit 50, which includes the circuit 20 of FIGS. 1, 2, 3, or some other embodiment of the invention. The memory circuit 50 includes an address register 52, which receives an address from an ADDRESS bus. A control log circuit 54 receives a clock (CLK) signal, and receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory circuit 50. A row address multiplexer 56 receives the address signal from the address register 52 and provides the row address to the row-address latch-and-decode circuits 58a and 58b for a memory bank 60a or 60b, respectively. During read and write cycles, the row-address latch-and-decode circuits 58a and 58b activate the word lines of the addressed rows of memory cells in the memory banks 60a and 60b, respectively. Read/write circuits 62a and 62b read data from the addressed memory cells in the memory banks 60a and 60b, respectively, during a read cycle, and write data to the addressed memory cells during a write cycle. A column-address latch-and-decode circuit 64 receives the address from the address register 52 and provides the column address of the selected memory cells to the read/write circuits 62a and 62b. For clarity, the address register 52, the row-address multiplexer 56, the row-address latch-and-decode circuits 58a and 58b, and the column-address latch-and-decode circuit 64 can be collectively referred to as an address decoder.

A data input/output (I/O) circuit 66 includes a plurality of input buffers 68. During a write cycle, the buffers 68 receive and store data from the DATA bus, and the read/write circuits 62a and 62b provide the stored data to the memory banks 60a and 60b, respectively. The data I/O circuit 66 also includes a plurality of output drivers 70, such as the output driver 42 of FIG. 4. During a read cycle, the read/write circuits 62a and 62b provide data from the memory banks 60a and 60b, respectively, to the drivers 70, which in turnprovide this data to the DATA bus.

A refresh counter 72 stores the address of the row of memory cells to be refreshed either during a conventional auto-refresh mode or self-refresh mode. After the row is refreshed, a refresh controller 74 updates the address in the refresh counter 72, typically by either incrementing or decrementing the contents of the refresh counter 72 by one. Although shown separately, the refresh controller 74 may be part of the control logic 54 in other embodiments of the memory circuit 50.

The memory circuit 50 may also include an optional charge pump 56, which steps up the power-supply voltage $V_{DD}$ to a voltage $V_{DDP}$. In one embodiment, the pump 56 generates $V_{DDP}$ approximately 1–1.5V higher than $V_{DD}$. The memory circuit 50 may also use $V_{DDP}$ to conventionally overdrive selected internal transistors.

Figure 6:
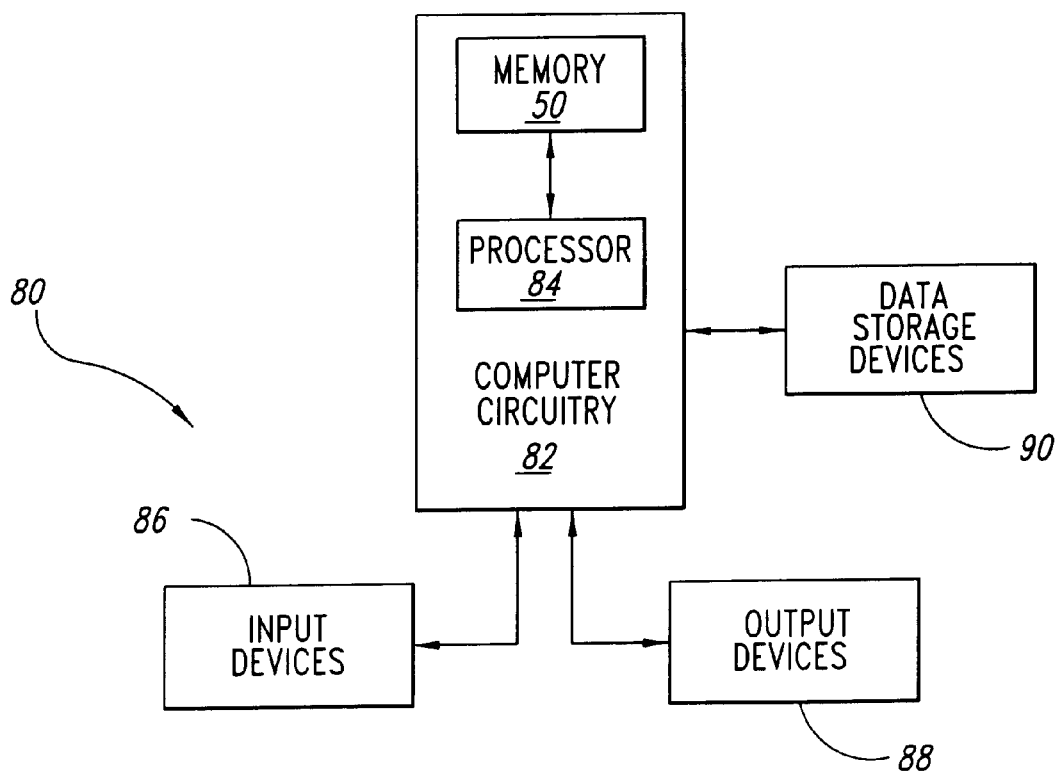
FIG. 6 is a block diagram of a computer system that includes the memory circuit of FIG. 5.

FIG. 6 is a block diagram of an electronic system 80, such as a computer system, that incorporates the memory circuit 50 of FIG. 5. The system 80 includes computer circuitry 82 for performing computer functions, such as executing software to perform desired calculations and tasks. The circuitry 82 typically includes a processor 84 and the memory circuit 50, which is coupled to the processor 84. One or more input devices 86, such as a keyboard or a mouse, are coupled to the computer circuitry 82 and allow an operator (not shown in FIG. 6) to manually input data thereto. One or more output devices 88 are coupled to the computer circuitry 82 to provide to the operator data generated by the computer circuitry 82. Examples of such output devices 88 include a printer and a video display unit. One or more data-storage devices 90 are coupled to the computer circuitry 82 to store data on or retrieve data from external storage media (not shown in FIG. 6). Examples of the storage devices 90 and the corresponding storage media include drives that accept hard and floppy disks, tape cassettes, and compact disk read-only memories (CD-ROMs). Typically, the computer circuitry 82 includes address data and command buses and a clock line that are respectively coupled to the ADDRESS, DATA, and COMMAND buses, and the CLK line of the memory circuit 50.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of processing a semiconductor circuit, comprising:
    isolating a conductive region of the semiconductor circuit from a substrate region of the semiconductor circuit while forming the semiconductor circuit; and
    connecting the conductive region to the substrate region after the forming of the semiconductor circuit is completed.

2. The method of claim 1 wherein:
    the isolating comprises deactivating a transistor that is coupled between the conductive and substrate regions; and
    the connecting comprises activating the transistor.

3. The method of claim 1 wherein the connecting comprises connecting the conductive region to the substrate region during testing of the semiconductor circuit.

4. The method of claim 1, further comprising coupling a substrate-region bias voltage to the conductive region after the forming of the semiconductor circuit is completed.

5. The method of claim 1
    wherein the connecting comprises connecting the conductive region to the substrate region during testing of the semiconductor circuit; and
    further comprising isolating the conductive region from the substrate region during normal operation of the semiconductor circuit.

6. The method of claim 1 wherein the substrate region is continuous with a substrate of the semiconductor circuit.

7. The method of claim 1 wherein:
    the substrate region comprises a well region of a substrate of the semiconductor circuit; and
    the substrate and the well region have different conductivities.

8. The method of claim 1 wherein:
    the substrate region comprises a well region of a substrate of the semiconductor circuit; and the substrate and the well region have a same conductivity.

9. A method of processing a semiconductor circuit having a conductive region and a substrate region, comprising:
electrically isolating the conductive region from the substrate region while forming the semiconductor circuit; and
electrically connecting the conductive region to the substrate region after forming the semiconductor circuit.

10. The method of claim 9 wherein electrically isolating the conductive region comprises deactivating a transistor that is coupled between the conductive region and the substrate region.

11. The method of claim 9 wherein electrically connecting the conductive region comprises activating a transistor that is coupled between the conductive region and the substrate region.

12. The method of claim 9 wherein the electrically isolating the conductive region comprises electrically isolating the conductive region from the substrate region during at least one of an etching and a depositing of a component of the semiconductor circuit.

13. The method of claim 12 wherein the electrically isolating the conductive region from the substrate region during at least one of an etching and a depositing of a component of the semiconductor circuit includes electrically isolating the conductive region from the substrate region during a vapor deposition of a bias pad.

14. The method of claim 12 wherein the electrically isolating the conductive region from the substrate region during at least one of an etching and a depositing of a component of the semiconductor circuit includes electrically isolating the conductive region from the substrate region during an etching of a passivation layer.

15. The method of claim 9 wherein the electrically connecting the conductive region comprises electrically connecting the conductive region to the substrate region during testing of the semiconductor circuit.

16. The method of claim 9 wherein the electrically isolating the conductive region from the substrate region comprises electrically isolating the conductive region during normal operation of the semiconductor circuit.

* * * * *